(12) United States Patent
Novakovsky et al.

(10) Patent No.: US 7,073,141 B2
(45) Date of Patent: Jul. 4, 2006

(54) DEVICE, SYSTEM AND METHOD FOR VLSI DESIGN ANALYSIS

(75) Inventors: Alexander Novakovsky, Haifa (IL); Shy Shyman, Binyamina (IL); Ziyad Hanna, Haifa (IL)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 10/720,672

(22) Filed: Nov. 25, 2003

(65) Prior Publication Data

US 2005/0114805 A1 May 26, 2005

(51) Int. Cl.
*G06F 17/50* (2006.01)
(52) U.S. Cl. .............................................. 716/4; 716/5
(58) Field of Classification Search .................... 716/5, 716/4
See application file for complete search history.

(56) References Cited

U.S. PATENT DOCUMENTS

| | | | | |
|---|---|---|---|---|
| 6,438,734 B1 * | 8/2002 | Lu | ................................ | 716/7 |
| 6,711,534 B1 * | 3/2004 | Parashkevov | ................ | 703/15 |
| 6,745,160 B1 * | 6/2004 | Ashar et al. | ................... | 703/14 |

OTHER PUBLICATIONS

Novakovsky, S.; Shyman, S.; Hanna, Z.; "High capacity and automatic functional extraction tool for industrial VLSI circuit designs"; Computer Aided Design, 2002. ICCAD 2002. IEEE/ACM International Conference on Nov. 10-14, 2002 pp.: 520-525.*

Jolly, Simon; Parashkevov, Atanas; McDougall, Tim: "Automated Equivalence Checking of Switch Level Circuits", pp. 299-304; DAC 2002, Jun. 10-14, 2002, New Orleans, Louisiana, USA.

Kuehlmann, A.: Srinivasan, A.: "Verity—a formal verification program for custom CMOS circuits": IBM Journal of Research & Development, Jan.-Mar. 1995, vol. 39, Issue 1 of 2, p. 149, 17p., 3 charts, 9 diagrams.

(Continued)

*Primary Examiner*—Vuthe Siek
*Assistant Examiner*—Tuyen To
(74) *Attorney, Agent, or Firm*—Pearl Cohen Zedek Latzer, LLP

(57) ABSTRACT

A device, system and method for analysis of Very Large Scale Integration circuit designs. A computing platform may, for example, find one or more loops in a circuit design, functionally analyze the loops, and extract one or more Register-Transfer-level logical elements in relation to the analysis result. A computing platform may, for example, identify a group of at least one Channel Connected Sub-Network that forms at least one combinational loop, generate overall zero-delay collapsed functionality on an output of said group, identify one or more functional parts that form said group, and replace the group with one or more corresponding logically equivalent Register-Transfer-level devices.

42 Claims, 2 Drawing Sheets

OTHER PUBLICATIONS

Fischer et al. "Abstraction of Schematic to High Level HDL. Design", Technology, Intel Israel (74) Ltd. ICCAD 1990, pp. 90-96.

Kam et al., "Comparing Layouts with HDL Models: A Formal Verification Technique", IEEE, 1992, pp. 588-591.

Kam et al., "State Machine Abstraction from Circuit Layouts using BDD's: Application in Verifications and Synthesis", IEEE, 1992, pp. 92-97.

Lester et al.: LIP6/ASIM Laboratory, University Pierre et Marie Curie-Paris: "Yagle, a second generation functional abstractor for CMOS VLSI Circuits", 1998, pp. 265-268.

Bryant:"Boolean analysis of MOS circuits", IEEE Transaction on computer-aided design, vol. CAD-6, No. 4 Jul., 1987, pp. 634-649.

Bryant, "Extraction of gate level models from transistor circuits by four valued symbolic analysis", IEEE, 1991, pp. 350-353.

* cited by examiner

DEVICE, SYSTEM AND METHOD FOR VLSI DESIGN ANALYSIS

BACKGROUND OF THE INVENTION

In the field of Very Large Scale Integration (VLSI) design, a circuit may include, for example, millions or billions of transistors, resistors, capacitors, and various other electrical components. Such components are typically interconnected, for example, on one or more semiconductor "chips", in order to perform one or more functions. Detecting and rectifying logical errors in a circuit design may be difficult, time-consuming and effort-consuming.

Some methods, based on Binary Decision Diagram (BDD) building, focus on extracting a functional behavior from a circuit by computing "micro-latch" pull-up and pull-down functions for each storage node in the circuit, and by building a transition relation of these functions. These methods may have limited capacity; building a transition relation of an entire sequential circuit may be inefficient and may require significant memory capacity or storage capacity.

Other methods are based on pattern-matching, and may use graph isomorphism algorithms to identify circuit configurations based on a pre-defined set of circuit patterns, for example, domino logic or latches. These methods may be limited or inefficient, since they may not cover all the possible configurations in a circuit. In some methods, user intervention may be required, for example, to enrich the pre-defined pattern set, or to add hints and attributes to help identify unresolved circuit configurations.

Another method tries to analyze a Metal-Oxide-Silicon (MOS) circuit using graph algorithms, by extracting functional behavior of Channel Connected Sub-Networks (CCSNs) using a Gaussian elimination procedure. However, this method focuses on unit delay analysis, and may not be applicable to analyzing and extracting a Register-Transfer (RT) level model.

These methods may suffer from various problems, for example, inefficiency problems and capacity limitations. Some of these problems may be partially mitigated by partitioning a circuit, but this may also be inefficient, time-consuming, and prone to errors.

There is a need for a powerful solution to analyze a circuit, extract its logic behavior, detect errors and resolve wrong or unsafe circuit implementations. There is also a need to generate gate-level or RT-level circuit representation, for example, for further verification against a Hardware Description Language (HDL) specification, for efficient timing or power analysis, for Automatic Test Pattern Generation (ATPG) simulation, for fault grading simulations, or to be used by a suitable VLSI Computer Aided Design (CAD) tool that may operate on switch level models

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1:
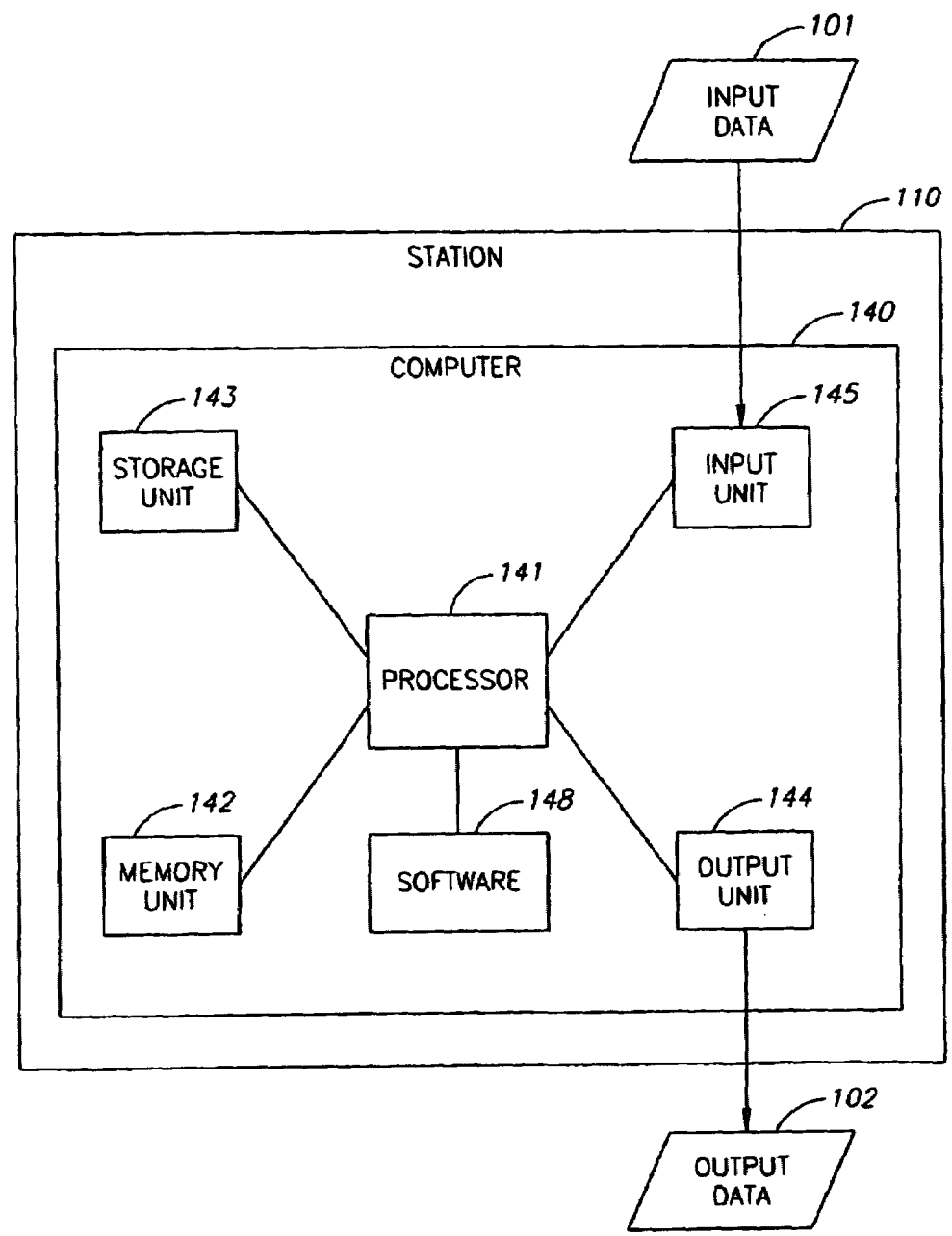
FIG. 1 is a schematic illustration of a station in accordance with an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

FIG. 1 schematically illustrates a station 110 in accordance with some embodiments of the invention. Station 110 may be used, for example, to perform VLSI design or VLSI circuit analysis in accordance with some embodiments of the invention. Station 110 may be a computing platform or a computing device. For example, station 110 may include a personal computer, a desktop computer, a mobile computer, a laptop computer, a notebook computer, a terminal, a workstation, a server computer, a Personal Digital Assistant (PDA) device, a tablet computer, a specialized or dedicated design device or analysis device, a network device, a net-work, or the like. Station 110 may be implemented using any suitable combination of hardware components and/or software components.

In the example shown in FIG. 1, station 110 may include a computer 140, which may include, for example, one or more processors 141, one or more memory units 142, one or more storage units 143, an output unit 144, an input unit 145, and software 148. Station 110 may include other suitable components or sets of components.

Processor 141 may include, for example, a Central Processing Unit (CPU), a Digital Signal Processor (DSP), one or more controllers, or any suitable specific and/or general and/or multi-purpose processor or micro-processor or controller. Memory unit 142 may include, for example, a Random Access Memory (RAM), a Read Only Memory (ROM), a Dynamic RAM (DRAM), or other suitable memory units. Storage unit 143 may include, for example, a hard disk drive, a floppy disk drive, a Compact Disk (CD) drive, a CD-ROM drive, or other suitable removable or non-removable storage units or memory modules. Output unit 144 may include, for example, a monitor or a printer. Input unit 145 may include, for example, a keyboard, a mouse, a touch-pad, or a scanner. It is noted that processor 141, memory unit 142, storage unit 143, output unit 144 and/or input unit 145 may include other suitable components and/or implementations as is known in the art.

Software 148 may include, for example, one or more operating systems (e.g., Microsoft Windows, Linux, Unix, Apple OS, Solaris, Sun-OS, HP-UX, or other suitable operating systems), one or more software applications, one or more drivers, and/or various other suitable software components. Software 148 may include, for example, VLSI design software, circuit design software, VLSI analysis software, circuit analysis software, VLSI debugging software, circuit debugging software, software implementing one or more methods in accordance with embodiments of the invention, and/or other suitable software components.

In some embodiments, station 110 may receive input data 101 and may produce output data 102. Input data 101 may include, for example, a schematic netlist of a circuit, or another suitable description or representation of a VLSI circuit design. Input data 101 may include, for example, directed graph data in which graph vertices may be characterized by. Boolean logic or combinatorial logic. Input data 101 may include other suitable data or information.

Input data 101 may be formatted and/or received, for example, in a suitable structural format, e.g., Structural Verilog. Input data 101 may include, for example, data in one or more low-level structural non-logical representation formats. These formats may be compliant, partially-compliant or non-compliant with various standards of Electronic Design Automation (EDA), for example, with Electronic Design Interchange Format (EDIF). Other suitable formats may be used.

Input data 101 may be entered into station 110 manually and/or automatically. Input data 101 may include data in various suitable types and/or formats. In some embodiments, input data 101 may include, for example, user input, manual input, configuration data, and/or commands or instructions provided by a user; in one embodiment, station 110 and/or other suitable devices may be used, for example, by a user to produce and/or provide such input data 101 to station 110. Input data 101 may be stored, for example, in memory unit 142, storage unit 143, or other suitable storage components and/or devices which may be internal and/or external to station 110.

In some embodiments, the schematic netlist of input data 101 may include, for example, a common representation of a detailed circuit specification that may be used by a circuit simulator, a circuit design tool, or other suitable VLSI CADtools. In one embodiment, the schematic netlist may include, for example, a list of circuit components, cells and/or modules, and representations of interconnections between these components, cells and/or modules. The schematic netlist may include, for example, a flat netlist or a hierarchical netlist. It is noted that in one embodiment, using a hierarchical netlist may allow various benefits, for example, faster VLSI design analysis and/or smaller memory consumption.

Output data 102 may include, for example, suitable VLSI design data. Output data 102 may include data in one or more levels of abstraction. In some embodiments, output data 102 may include, for example, a description in gate level and/or HDL RT-Level. Output data 102 may include, for example, data represented in Verilog (e.g., Verilog 2000, V2K, or System Verilog), Very High Speed Integrated Circuit HDL (VHSIC HDL or VHDL), Berkeley Logic Interchange Format (BLIF), or other suitable zero-delay binary formats. Output data 102 may include, for example, data in Finite State Machine (FSM) level, which may describe and/or represent states and/or registers, as well as transitions between states and/or registers. Output data 102 may include, for example, structural data, behavioral data, logical data, Boolean data, non-logical data and/or non-Boolean data. Output data 102 may include other suitable types and/or formats of data.

In some embodiments, output data 102 may be produced and/or provided, for example, as one or more data files. Output data 102 may be stored, for example, in memory unit 142, storage unit 143, or other suitable storage components and/or devices which may be internal and/or external to station 110. In some embodiments, output data 102 may be printed (e.g., using a printer which may be connected to station 110) or may be presented on a monitor (e.g., using output unit 144). Output data 102 may be read and/or used, for example, manually by a user and/or automatically by a machine or a computer. In some embodiments, output data 102 may be further presented and/or manipulated using a suitable User Interface (UI), for example, a textual UI or a Graphical UI (GUI). Output data 102 may be provided, stored, presented and/or produced using other data formats, components and/or devices.

It is noted that station 110 and/or computer 140 may include various other components, and/or may be configured with additional and/or alternative units. Further, station 110 and/or computer 140 may be implemented using any suitable combination of hardware and/or software, and may include any circuit, circuitry, controller, gate, buffer, unit or combination of integrated and/or separate units or circuits, as are known in the art, to perform desired functionalities.

In accordance with some embodiments of the invention, a VLSI circuit model may include representations of one or more Combinational Logical Devices (CLDs), Sequential Logical Devices (SLDs), and/or other suitable items or devices. A CLD may include, for example, a dynamic implementation of one or more combinational functions (e.g., a "domino" device), or other devices or items. An SLD may include, for example, an implementation of one or more storage elements (e.g., latches or bus keepers), or other items. In accordance with embodiments of the invention, a VLSI circuit model may include representation of other suitable devices, components, elements, logical elements, or items.

Figure 2:
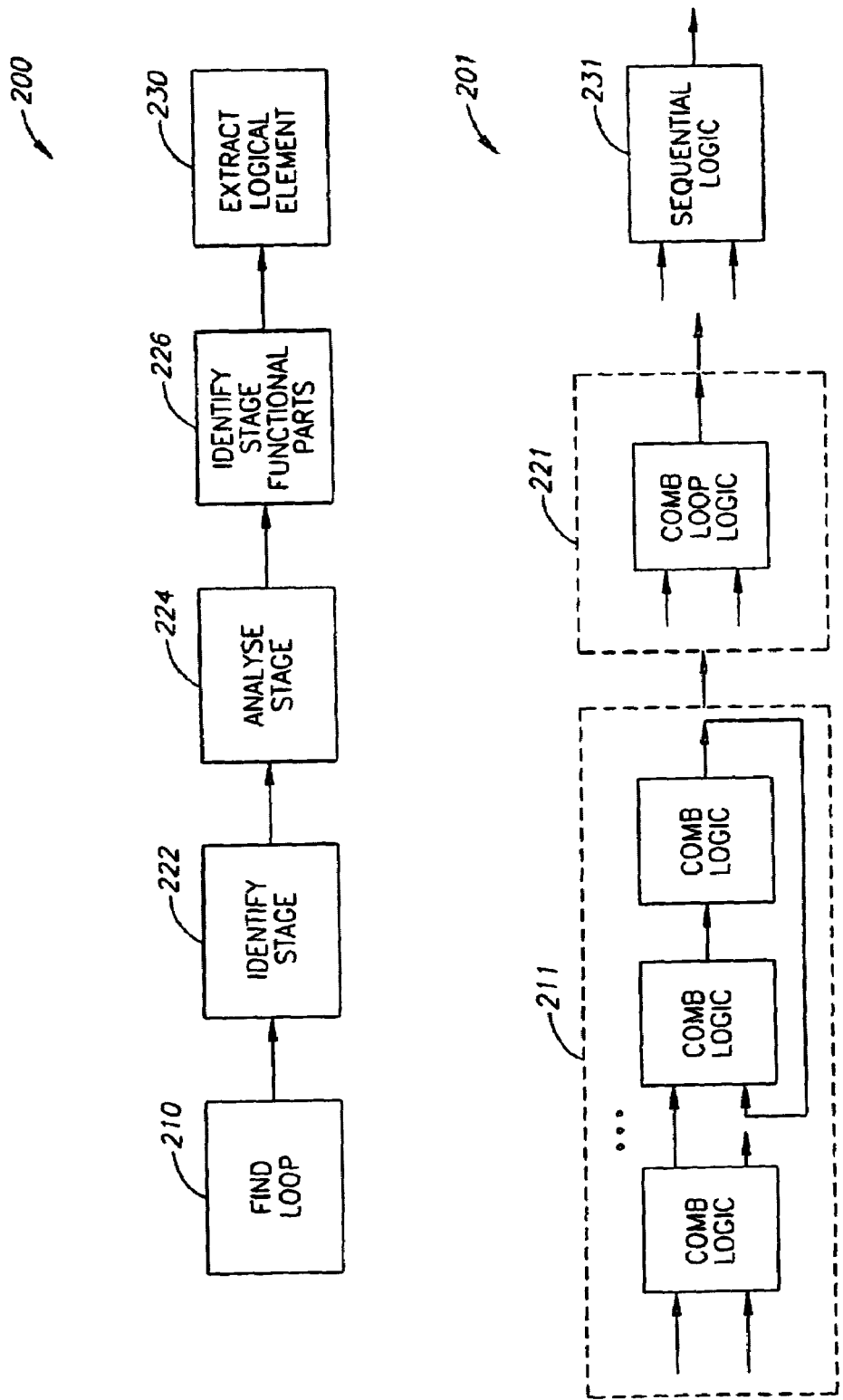
FIG. 2 is a flow chart diagram of a method of analysis, shown together with corresponding exemplary results of such method, in accordance with an embodiment of the invention.

FIG. 2 includes a flow chart diagram 200 of a method of analysis in accordance with some embodiments of the invention. For exemplary purposes, FIG. 2 further illustrates a set of results 201 which may correspond to some of the operations performed using the method of FIG. 2. It is noted that the set of results 201 is presented as an example only, and various other operational results may be achieved using the method of FIG. 2 or using other methods in accordance with embodiments of the invention. Further, various other operations or sets of operations may be used. In one embodiment, for example, a processor or a computing platform may identify a group of at least one CCSN that forms at least one combinational loop, generate overall zero-delay collapsed functionality on an output of said group, identify one or more functional parts that form said group, and replace the group with one or more corresponding logically equivalent RT-level devices.

As indicated at block 210, one or more loops that relate to the same single sequential element may be identified, found and analyzed together. This may be performed, for example, automatically (e.g., using station 110 or other suitable computing platform). An exemplary result of this operation is schematically illustrated in block 211, indicating a plurality of combinational logic elements. In some embodiments, a loop may include, for example, a traversing path in a directed graph (which may include, for example, vertexes and directed edges) which may begin and end at one vertex.

In some embodiments, loops and/or loop structures may be detected in CLDs and/or SLDs. In accordance with some embodiments, a Combinational Loop (C-Loop) or a combinatorial loop may, for example, form a single SLD (e.g., a latch), or may be a part of a dynamic implementation of a CLD. In some embodiments, a Sequential Loop (S-Loop)

may span over one or more SDLs. In some embodiments, other loops and/or loop structures may be detected and/or analyzed.

In some embodiments, S-Loops may be left in an extracted design, for example, to form an FSM of the circuit, and C-Loops may be resolved. In accordance with embodiments of the invention, input data 101 may include, for example RT-level data and/or FSM data, which may include zero-delay representations with a set of states and combinational blocks that may perform transitions in-between these states; transition from a first state to a second state may be performed in zero time. In some embodiments, a combinational block may include a loop. An S-Loop, for example, may be controlled by a clock (e.g., a clock of the processor or the chip which may be produced based on the VLSI circuit design being analyzed), and may have a delay (e.g., an N-cycles delay) in accordance with an FSM structure. In accordance with some embodiments, a C-Loop may be resolved, for example, it may be replaced by a state element (e.g., one or more states may be added to the FSM data), or it may be replaced by a logically equivalent pure combinational non-loop logic (e.g., it may be proved that the C-Loop may stabilize in a period of time which may be significantly shorter than one clock cycle).

In accordance with some embodiments, C-Loops may be distinguished from S-Loops, or vice versa, based on one or more pre-defined criteria. In one embodiment, for example, it may be assumed and/or pre-determined that an S-Loop has a longer path than a C-Loop; this may hold true, for example, since an S-Loop may pass through at least one smaller C-Loop that may form its state device. In some embodiments, for example, a C-Loop may include two structural elements (e.g., two inverted elements). An S-Loop, for example, may include a path in an FSM representation which may pass through at least two states; a state element may have two structural elements between its input and its output (e.g., a driver and a repeater); therefore, in one embodiment, an S-Loop may be at least twice longer than a C-Loop. Other suitable criteria for distinguishing between S-Loops and C-Loops and/or for identifying S-Loops and/or C-Loops may be used.

Based on a pre-defined criteria, a loop identification process may be performed, for example, to find and/or analyze structural loops. In some embodiments, the loop identification process may be performed in several phases, and may begin, for example, from one or more shortest loops or relatively short loops. In some embodiments, a short loop may include, for example, a loop that includes one or few CCSNs. In one embodiment, it may be determined, for example, that a short loop may not be an S-Loop, and may be a C-Loop.

In one embodiment, a list of loops found, identified and/or detected in a circuit design, may optionally be stored for a short or long period of time, for example, in memory unit 142, in storage unit 143, in a suitable file or database, and/or in other suitable storage medium and/or format.

In some embodiments, structural loops formed by a single CCSN may be handled differently than structural loops formed by two or more CCSNs. For example, in one embodiment, a structural loop formed by a single CCSN, or caused by accumulative capacitance storage capability, may be identified by checking self logical dependencies on the nodes of the CCSN. In some embodiments, a structural loop formed by two or more CCSNs may be identified, for example, using a Depth First Search (DFS) linear traversal algorithm; the algorithm may, for example, traverse through all or substantially all possible loop paths. It is noted that in some embodiments, using the DFS linear traversal algorithm may be efficient, for example, since many structural loops may be small and even bounded, and the run-time of the algorithm may be reasonable. Other suitable algorithms or criteria may be used in accordance with embodiments of the invention.

In some embodiments, as indicated at blocks 222 to 226, upon identification of a loop, the loop may be analyzed and its logical elements may be identified. It is noted that in accordance with some embodiments of the invention, if the loop represents an SLD, then it may be used for breaking and/or analyzing longer S-Loops. For example, in one embodiment, a C-Loop may not pass through a state element; therefore, finding a short SDL and replacing it with a logically equivalent state element, may allow (e.g., in a further iteration of loop finding) filtering out longer loop paths that may pass through the already-found state.

In accordance with some embodiments of the invention, a functional loop analysis and inference may be performed on one or more of the loops found as indicated at block 210. An exemplary result of this operation is schematically illustrated in block 221, indicating a C-Loop logic.

In some embodiments, a set of C-Loops may be analyzed, for example, to identify their corresponding logical elements. This may include, for example, analysis using one or more of the equations described herein; other suitable equations, functions and/or calculations may be used in accordance with embodiments of the invention. In one embodiment, the analysis of the set of C-Loops may include analysis of the set together with additional logic surrounding the set. In some embodiments, as indicated at block 222, the analysis may include, for example, identification and/or analysis of one or more stages. This may be performed, for example, automatically (e.g., using station 110 or other suitable computing platform). In accordance with some embodiments, a stage may include, for example, one or more CCSNs that form one or more C-Loops and correspond to a functional device (e.g., to a CLD or an SLD). In one embodiment, stage identification may include, for example, collapsing a loop logic into one expression and simplifying the expression, e.g., using relations between variables of the expressions. Other suitable criteria may be used for defining and/or identifying a stage.

In one embodiment, a stage may include, for example, a driving logic, a feedback path, and a collateral logic. A driving logic may include, for example, a combinational logic that may introduce new values into the C-Loops during execution of the circuit. A feedback path may include, for example, a logic function that may be used to store one or more current values in case the driving logic is disables. A collateral logic may include, for example, a logic that may be used to simplify the overall functionality of the stage. In accordance with embodiments of the invention, a stage may include other suitable elements.

In some embodiments, identified loops may be separated into groups. In one embodiment, all groups or substantially all groups may include single-stage groups. In accordance with embodiments of the invention, other grouping of one or more stages may be used, and other criteria may be used to identify and/or define one or more groups. In some embodiments, loops may be combined or grouped together with a common loop output signal, for example, where the loop logic may be resolved on.

In one embodiment, a stage may include more data than a group of loops. For example, a stage may include surrounding logic that may simplify its logical behavior. In one embodiment, for example, a latch may be controlled by a "clock" signal and a "clock#" signal, wherein "clock#" may be an inversion of "clock"; a corresponding state may include, for example, the "clock" signal, the "clock#" signal, and an inverter between these two signals (or other suitable indication or representation of the inversion). In some embodiments, a group of loops may be contained by a one stage.

In accordance with embodiments of the invention, as indicated at block 224, a stage may be analyzed. This may be performed, for example, automatically (e.g., using station 110 or other suitable computing platform). In one embodiment, for example, the stage analysis may include identification of one or more stages. The stage analysis may be based on pre-defined assumptions and/or criteria. The stage analysis may include, for example, generation of overall zero-delay collapsed stage functionality on the output of the stage. This operation may be based, for example, on assumption that loop nets may not include an X value (a short driving control path value) or a Z value (a floating value); this assumption may be checked, for example, using a verification session. Other suitable assumptions and/or pre-defined criteria may be used in stage analysis.

As indicated at block 226, stage inference may be performed. This may be performed, for example, automatically (e.g., using station 110 or other suitable computing platform). In some embodiments, stage inference may include, for example, identification of functional parts that may form on the stage, or partitioning the stage into functional parts. These functional parts may include, for example, set logic, reset logic, driving control logic, driving data logic, feedback control, feedback logic, asynchronous set/rest, clock/enable, driving data, feedback type, control, and/or other suitable parts. For example, in one embodiment, in a stage which may include a latch, stage inference may result a clock signal or expression, a driving data or expression, a full keeper logic of the feedback, and a condition in which the feedback may hold (e.g., feedback control may be opposite to the clock of a latch). Other functional parts may be identified.

It should be appreciated that in some embodiments, one or more of the equations presented herein may be used for stage analysis and/or stage inference; however, the present invention is not limited in this respect, and various other suitable equations, functions, calculations, algorithms and/or criteria may be used for analysis and/or inference in accordance with embodiments of the invention.

In some embodiments, overall stage logic, S, may be collapsed, for example, into the following form:

$$S = f(i1, i2, \ldots, S'), \quad \text{Equation 1}$$

wherein $f$ may include a dual rail function that may drive S in quaternary format, wherein S' may be the previous value of S itself, and wherein i parameters may be input signals of the stage or variables of the stage expression. Other suitable equations, functions, calculations, algorithms and/or criteria may be used in accordance with embodiments of the invention.

In accordance with embodiments of the invention, stage functional parts may be identified, determined and/or calculated, for example, using one or more pre-defined criteria, functions and/or equations. In one embodiment, stage functional parts may be identified using dual rail logic manipulations on the function $f$, for example, using Directed Acyclic Graph (DAG) and BDD representations. Other suitable equations, functions, calculations, algorithms and/or criteria may be used in accordance with embodiments of the invention Driving logic, D, may be identified, determined and/or calculated. In one embodiment, the driving logic may include, for example, a part of the stage formula that does not depend on the previous value of the state; the driving logic may be identified, for example, by quantifying out the variable S' from $f$. The driving logic may be identified, for example, using the following equation:

$$D = S(S' = 1) \,\&\&\, S(S' = 0) \quad \text{Equation 2}$$

Other suitable equations, functions, calculations, algorithms and/or criteria may be used in accordance with embodiments of the invention.

In some embodiment, stage inference may include, for example, breaking or partitioning the stage into a driver and a feedback (or sustainer), and optionally further breaking or partitioning these parts into smaller stage components (e.g., set, reset, data and clock). For example, in one embodiment, a latch with one data signal and one clock signal may have a dual-rail overall collapsed logic which may be represented as follows:

output.$h = c.h * d.h + \text{not}(c.h) * $output.$h$ output.$l = c.h * d.l + \text{not}(c.h) * $output.$l$ In some embodiments, analyzing this logic may indicate a latch (e.g., full keeper feedback), in which the data may be equal to d and the clock may be equal to c. In some embodiment, in accordance with such stage analysis and stage inference, output data 102 may include a latch, e.g., an HDL statement of a latch, or a suitable latch symbol if output data 102 is presented using a GUI.

Driving control, DC, may be identified, determined and/or calculated. In one embodiment, this may be performed, for example, when either high rail or low rail of the driving logic holds. The driving control may be identified, for example, using the following equation:

$$DC = D.l \,\|\, D.h \quad \text{Equation 3}$$

Other suitable equations, functions, calculations, algorithms and/or criteria may be used in accordance with embodiments of the invention Stage feedback logic, FB, may be identified, determined and/or calculated. For example, it may be assumed that contention on the stage output may be checked using CCSN extracted logic. The feedback logic may be identified, for example, using the following equation:

$$FB = S \,\&\&\, !DC \quad \text{Equation 4}$$

Other suitable equations, functions, calculations, algorithms and/or criteria may be used in accordance with embodiments of the invention Feedback control, FBC, may be identified, determined and/or calculated, for example, using the following equation:

$$FBC = FB.1 || FB.h \qquad \text{Equation 5}$$

Other suitable equations, functions, calculations, algorithms and/or criteria may be used in accordance with embodiments of the invention Stage feedback type may be identified, determined and/or calculated. For example, in some embodiment, a stage feedback may be identified to have a high retain type logic, a low retain type logic, a full retain type logic, and/or a self-reset feedback type. Other types of stage feedback may be identified, determined and/or calculated. In one embodiment, the identification of the type of the stage feedback may be performed, for example, by checking how "zero" and "one" values on the stage output are propagated by the feedback logic. For example, in some embodiments, the feedback may have high retain type logic if the following equation holds:

$$(FB.h(S' = 1) != 0) \&\& (FB.h(S' = 0) = 0) \qquad \text{Equation 6}$$

Other suitable equations, functions, calculations, algorithms and/or criteria may be used in accordance with embodiments of the invention In some embodiments, the feedback may have low retain type logic if, for example, the following equation holds:

$$(FB.1(S' = 0) != 0) \&\& (FB.1(S' = 1) = 0) \qquad \text{Equation 7}$$

Other suitable equations, functions, calculations, algorithms and/or criteria may be used in accordance with embodiments of the invention In some embodiments, the feedback may have full retain type logic if, for example, it is determined that the feedback has both high retain type logic and low retain type logic. For example, in one embodiment, the feedback may have full retain type logic if both equations 6 and 7 hold true.

Self-reset feedback type may be identified, determined and/or calculated, for example, when the following equation holds:

$$(FB.h(S' = 0) != 0) || (FB.1(S' = 1) != 0) \qquad \text{Equation 8}$$

Other suitable equations, functions, calculations, algorithms and/or criteria may be used in accordance with embodiments of the invention Alternatively, if the feedback logic propagates neither a "zero" value nor a "one" value, pure combinatorial logic may be identified, for example, when the following equation holds:

$$(FB.h(S' = 1) = 0) \&\& (FB.1(S' = 0) = 0) \qquad \text{Equation 9}$$

It such case, the loop may be considered a structural loop but not a functional loop. Other suitable equations, functions, calculations, algorithms and/or criteria may be used in accordance with embodiments of the invention In some embodiments, asynchronous set and reset logics may be identified, determined and/or calculated. In one embodiment, for example, asynchronous set and reset logics may be identified as independent parts of a driving control that leads a driving logic to "constant one" or to "constant zero", respectively.

It should be appreciated that the above properties, identifications, parameters, components, equations and/or logics are presented for exemplary purposes only, and that the present invention is not limited in this respect. In accordance with embodiments of the invention, various other properties, parameters, components and/or logics may be identified, determined and/or calculations, using various other suitable criteria, functions, equations and/or calculations.

As indicated at block 230, a logical element may be extracted, for example, based on the stage analysis results and/or stage inference results. This may be performed, for example, automatically (e.g., using station 110 or other suitable computing platform). An exemplary result of this operation is schematically illustrated in block 231, indicating sequential logic; various other results may be possible. It is noted that in some embodiments, after identifying one or more functional parts that form a group, the group may be replaced, for example, with one or more corresponding logically equivalent RT-level devices.

In some embodiments, extraction of logical elements may be performed, for example, in relation to inferred stage parts. Analysis of inferred stage parts may result in identification of one or more extracted stages or stage parts as one or more logical structures. For example, in one embodiment, the analysis may result in an identification of a bus retainer, a domino structure or a precharge logic, a latch, or a self-reset loop. Other structures, combinatorial elements and/or pure combinatorial elements may be identified based on the analysis.

In one embodiment, a domino structure may be identified, for example, if a driving logic is fully separated into a "set" path and a "reset" path, if one of the paths is controlled by a clock signal, and if the feedback loop forms a full keeper or a half keeper that matches a precharge logic polarity. Other conditions and/or criteria may be used to identify a domino structure and/or other structures. For example, using a similar process, a latch structure may be identified. In one embodiment, for example, two latches in a tour, with opposite control logic and same set/reset, may be identified and/or may be combined into one "flip-flop" sequential element.

In some embodiments, a method according to an embodiment of the invention may optionally include preparatory operations. For example, in one embodiment, functionality of the smallest logical circuit components (such as, for example, CCSNs) may be identified, determined and/or extracted prior to the loop finding of block 210. Such data may be stored, for example, in memory unit 142, storage unit 143, station 110, and/or other suitable components which may be internal or external to station 110.

A method according to an embodiment of the invention may be used, for example, to identify a CLD and/or to identify an SLD. The method may be performed, for example, using station 110 and/or computer 140.

In one embodiment, the method of FIG. 2 may be implemented, for example, using the following pseudo-code; other suitable pseudo-code, algorithm and/or set of instructions may be used, and may be included, for example, in software 148.

```
1 foundLoopList <- clear;        /* List of all structural loops in circuit */
2 stageMap      <- clear;
3 for loopLength from 1 till N {
4 extractStateOnly = (loopLength != N);     /* Control that allows combine several combinational loops */
5                                           /* found in different loopLength steps into one stage */
6 loopGroups = FindLoopGroups(loopLength);   /* Using standard DFS liner traversal algorithm */
7 for each loopGroup from loopGroups {
8 FindLoops(loopLength, foundLoopList);   /* Using standard, limited by length, exponential algorithm */
9 }
10
11 /* Separate found loops to stages on the loop output basis for further stage analysis */
12 for each loop from foundLoopList{
13 loopOutput = IdentifyLoopOutput(loop);   /* Different heuristics can be applied, in order to pick up */
14                                          /* the node we would like to resolve the loop on */
15 AddLoopToStage(stageMap[loopOutput], loop);
16 }
17
18 /* Analyze and resolve the stages */
19 for each stage from stageMap{
20 stageFormula = GenerateOverallZeroDelayCollapsedFunctionality(stage);
21 stageInfData = StageInference(stageFormular));
22 if(!extractStateOnly || extractStateOnly && isState(stageInfData)) {
23 GenerateSequentialDeviceInPlaceOfCombinationalLoop(stageInfData);
24 }
25 }
26 }
```

It is noted that the above pseudo-code is presented for exemplary purposes only, and that the present invention is not limited in this regard. In accordance with embodiments of the invention, other suitable pseudo-code, algorithms or sets of instructions may be used.

Embodiments of the invention may allow various benefits. Some embodiments may provide a generic solution for VLSI design analysis, which may not need to rely on specific circuit design styles, pattern matching, or specific input from a user. Some embodiments may allow efficient, powerful, and/or precise analysis of circuit design. Some embodiments may allow mitigating, eliminating and/or avoiding costly design errors and design delays, and may provide a robust solution for efficient, quick and/or automatic analysis of circuit designs. Some embodiments of the invention may be used, for example, in conjunction with static analysis methods, for example, static timing analysis, power estimation, and fault guarding activities. It is noted that some embodiments of the invention may allow various other benefits, in addition to or instead of the benefits described.

Some embodiments of the invention may be implemented, for example, using a machine-readable medium or article which may store an instruction or a set of instructions that, if executed by a machine (for example, by station 110, by processor 141 of station 110, and/or by other suitable machines), cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit (e.g., memory unit 142), memory device, memory article, memory medium, storage device, storage article, storage medium and/or storage unit (e.g., storage unit 143), for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

Some embodiments of the invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors, or devices as are known in the art. Some embodiments of the invention may include buffers, registers, storage units and/or memory units, for temporary or long-term storage of data or in order to facilitate the operation of a specific embodiment.

While certain features of the invention have been illustrated and described herein, many modifications, substitutions, changes, and/or equivalents may occur to those skilled in the art. It is, therefore, to be understood that the appended claims are intended to cover all such modifications and/or changes.

What is claimed is:

1. A method for VLSI design analysis, the method comprising:

in a processor, finding a loop in a circuit design;

in the processor, functionally analyzing the loop;

in the processor, extracting a logical element in relation to an analysis result; and in the processor, automatically resolving the loop by performing an operation selected from a group consisting of: replacing the loop with a state element in a Finite State Machine level, and replacing the loop by a logically equivalent pure combinational non-loop logic.

2. The method of claim 1, comprising performing a Depth First Search linear traversal.

3. The method of claim 1, comprising identifying a group of at least one Channel Connected Sub-Network that forms at least one combinational loop and corresponds to a functional device.

4. The method of claim 3, comprising generating overall zero-delay collapsed functionality on an output of said group.

5. The method of claim 3, comprising identifying a functional part that forms said group.

6. The method of claim 3, comprising determining a driving logic of said group.

7. The method of claim 3, comprising determining a driving control of said group.

8. The method of claim 3, comprising determining a stage feedback logic of said group.

9. The method of claim 3, comprising determining a stage feedback control of said group.

10. The method of claim 3, comprising determining a stage feedback type of said group.

11. The method of claim 3, comprising determining an asynchronous set and reset logics of said group.

12. The method of claim 1, wherein extracting a logical element comprises extracting a combinational logical element.

13. The method of claim 12, comprising performing an analysis of a group of at least one Channel Connected Sub-Network that forms at least one combinational loop and corresponds to a functional device.

14. The method of claim 12, comprising identifying a domino element.

15. The method of claim 12, comprising identifying a bus retainer.

16. The method of claim 12, comprising identifying a latch.

17. The method of claim 12, comprising identifying a self-reset loop.

18. The method of claim 12, comprising identifying a combinatorial element.

19. An apparatus for VLSI design analysis, the apparatus comprising:
a processor to find a loop in a circuit design, functionally analyze the loop, extract a logical element in relation to an analysis result, and automatically resolve the loop by performing an operation selected from a group consisting of: replacing the loop with a state element in a Finite State Machine level, and replacing the loop by a logically equivalent pure combinational non-loop logic.

20. The apparatus of claim 19, wherein the processor is to perform a Depth First Search linear traversal.

21. The apparatus of claim 19, wherein the processor is to identify a group of at least one Channel Connected Sub-Network that forms at least one combinational loop and corresponds to a functional device.

22. The apparatus of claim 21, wherein the processor is to generate overall zero-delay collapsed functionality on an output of said group.

23. The apparatus of claim 21, wherein the processor is to identify a functional part that forms said group.

24. The apparatus of claim 21, wherein the processor is to determine a driving logic of said group.

25. The apparatus of claim 21, wherein the processor is to determine a driving control of said group.

26. The apparatus of claim 21, wherein the processor is to determine a stage feedback logic of said group.

27. The apparatus of claim 21, wherein the processor is to determine a stage feedback control of said group.

28. The apparatus of claim 21, wherein the processor is to determine a stage feedback type of said group.

29. The apparatus of claim 21, wherein the processor is to determine an asynchronous set and reset logics of said group.

30. The apparatus of claim 19, wherein the processor is to extract a combinational logical element.

31. The apparatus of claim 30, wherein the processor is to perform an analysis of a group of at least one Channel Connected Sub-Network that forms at least one combinational loop and corresponds to a functional device.

32. The apparatus of claim 30, wherein the processor is to identify a domino element.

33. The apparatus of claim 30, wherein the processor is to identify a bus retainer.

34. The apparatus of claim 30, wherein the processor is to identify a latch.

35. The apparatus of claim 30, wherein the processor is to identify a self-reset loop.

36. The apparatus of claim 30, wherein the processor is to identify a combinatorial element.

37. An apparatus for VLSI design analysis, the apparatus comprising:
a dynamic random access memory; and
a processor to find a loop in a circuit design, functionally analyze the loop, extract a logical element in relation to an analysis result, and automatically resolve the loop by performing an operation selected from a group consisting of: replacing the loop with a state element in a Finite State Machine level, and replacing the loop by a logically equivalent pure combinational non-loop logic.

38. The apparatus of claim 37, wherein the processor is to identify a group of at least one Channel Connected Sub-Network that forms at least one combinational loop and corresponds to a functional device.

39. The apparatus of claim 38, wherein the processor is to identify a functional part that forms said group.

40. A machine-readable medium having stored thereon a set of instructions that, if executed by a machine, cause the machine to perform a method comprising:
finding a loop in a circuit design;
functionally analyzing the loop;
extracting a logical element in relation to an analysis result; and
automatically resolving the loop by performing an operation selected from a group consisting of: replacing the loop with a state element in a Finite State Machine level, and replacing the loop by a logically equivalent pure combinational non-loop logic.

41. The machine-readable medium of claim 40, wherein the instructions result in identifying a group of at least one Channel Connected Sub-Network that forms at least one combinational loop and corresponds to a functional device.

42. The machine-readable medium of claim 41, wherein the instructions result in identifying a functional part that forms said group.

* * * * *